(12) United States Patent
Stokkermans et al.

(10) Patent No.: US 12,394,747 B2
(45) Date of Patent: Aug. 19, 2025

(54) CURVED WAFER STAGE

(71) Applicant: NEXPERIA B.V., Nijmegen (NL)

(72) Inventors: Joep Stokkermans, Nijmegen (NL); Gijs van der Veen, Nijmegen (NL); Jasper Wesselingh, Nijmegen (NL); Patrick Houben, Nijmegen (NL)

(73) Assignee: NEXPERIA B.V., Nijmegen (NL)

( * ) Notice: Subject to any disclaimer, the term of this patent is extended or adjusted under 35 U.S.C. 154(b) by 388 days.

(21) Appl. No.: 18/169,647

(22) Filed: Feb. 15, 2023

(65) Prior Publication Data
US 2023/0260954 A1 Aug. 17, 2023

(30) Foreign Application Priority Data

Feb. 15, 2022 (EP) ..................................... 22156782

(51) Int. Cl.
*H01L 23/00* (2006.01)

(52) U.S. Cl.
CPC ...... *H01L 24/75* (2013.01); *H01L 2224/7565* (2013.01); *H01L 2224/75753* (2013.01); *H01L 2224/7598* (2013.01)

(58) Field of Classification Search
CPC ......... H01L 21/67132; H01L 21/67144; H01L 2224/7565; H01L 2224/75753; H01L 2224/7598; H01L 24/75
See application file for complete search history.

(56) References Cited

U.S. PATENT DOCUMENTS

| 2005/0204554 A1 | 9/2005 | Sillner |
| 2006/0037694 A1 | 2/2006 | Yamamoto et al. |
| 2017/0140959 A1 | 5/2017 | Huska et al. |
| 2023/0260954 A1* | 8/2023 | Stokkermans .... H01L 21/67144 414/433 |

FOREIGN PATENT DOCUMENTS

| EP | 2907660 A1 | 8/2015 |
| EP | 3442011 A1 | 2/2019 |
| WO | 2011007397 A1 | 1/2011 |

OTHER PUBLICATIONS

Extended European Search Report for corresponding European application EP22156782.9, 7 pages dated Aug. 8, 2022.

* cited by examiner

*Primary Examiner* — Sonya M Sengupta
(74) *Attorney, Agent, or Firm* — Ruggiero McAllister & McMahon LLC

(57) ABSTRACT

The disclosure relates to an apparatus for transferring a semiconductor die from an arrangement of semiconductor dies to a target and to a wafer stage to be used in such an apparatus. The wafer chuck includes a rotationally mounted curved shell on which the arrangement of semiconductor dies can be arranged, and the wafer stage includes a first motor for rotating the curved shell around a rotational axis. The curved configuration allows an improved throughput of the wafer stage. The film frame carrier used with this wafer stage comprises a ring-shaped body with an asymmetric bending stiffness allowing the ring-shaped body to be bent so that the mounting surface of the ring-shaped body changes from having a first shape to a second more concave shape and prevents or limits the ring-shaped body to be bent so that the shape of the mounting surface becomes more convex than the first shape.

17 Claims, 10 Drawing Sheets

CURVED WAFER STAGE

CROSS-REFERENCE TO RELATED APPLICATIONS

This application claims the benefit under 35 U.S.C. § 119(a) of European Application No. 22156782.9 filed Feb. 15, 2022, the contents of which are incorporated by reference herein in their entirety.

BACKGROUND

1. Field of the Disclosure

Aspects of the present disclosure relate to an apparatus for transferring a semiconductor die from an arrangement of semiconductor dies to a target. Further aspects of the present disclosure relate to a wafer stage to be used in such apparatus.

2. Description of the Related Art

An apparatus for transferring a semiconductor die from a diced semiconductor wafer to a target is known in the art. For example, US 2017140959 A1 discloses an apparatus that comprises a wafer stage having a wafer chuck on which a diced semiconductor wafer can be arranged, and a target stage having a target chuck on which the target can be arranged. Both the wafer stage and target stage comprise one or more motors for changing the mutual position between the diced semiconductor wafer on the wafer chuck and the target on the target chuck. The apparatus further comprises a releasing unit in the form of a needle for releasing a semiconductor die from the diced semiconductor wafer. The releasing unit, the wafer stage, and the target stage are controlled using a controller.

In the known system, a diced semiconductor wafer is brought into proximity of the target, which for example could be a printed-circuit board. When a semiconductor die on the semiconductor wafer is in alignment with an intended position on the target, the needle is brought into alignment with the semiconductor die. The needle then presses the semiconductor die away from the semiconductor wafer and onto the target.

The die transfer above is referred to as a direct die transfer. More in particular, the die is transferred from the diced semiconductor wafer onto the target without being placed or supported in between the steps of releasing the die and placing the die onto the target.

An important figure of merit for apparatuses of the type described above is the number of semiconductor dies that can be transferred per unit time. This time is often limited by the step of positioning the semiconductor wafer relative to the target.

SUMMARY

An aspect of the present disclosure is related to providing an apparatus for transferring a semiconductor die from an arrangement of semiconductor dies to a target that employs a different manner in which the arrangement of semiconductor dies is positioned relative to the target. According to an aspect of the present disclosure, this different manner of positioning may allow a reduction to be achieved in the amount of time that is required for transferring the semiconductor dies onto the target.

According to an aspect of the present disclosure, the wafer chuck of the apparatus comprises a rotationally mounted curved shell on which the arrangement of semiconductor dies can be arranged. Furthermore, the wafer stage comprises a first motor for rotating the curved shell around a rotational axis.

The apparatus disclosed in US 2017140959 A1 comprises a linear XY stage using linear motors configured for displacing the semiconductor wafer in an X direction and Y direction. The acceleration obtainable by such a wafer stage is limited by motor topology and power dissipation. To improve on the performance of these wafer stages, such as an increase in positioning speed, a moving coil topology would be necessary. This would however bring the associated problem of cooling a moving coil to increase power dissipation capability.

According to an aspect of the present disclosure, the problem of limited acceleration with linear motors is mitigated using a rotationally mounted curved shell on which the arrangement of semiconductor dies can be arranged. This shell is actuated using a first motor that is part of the wafer stage and that is configured for rotating the curved shell around a rotational axis.

Motors for imparting a rotational movement offer a higher force or torque per unit of dissipated heat and/or a higher force/torque per unit of power and per weight unit of the magnets used. This means that they can achieve higher accelerations for a given mass and power level than linear moving magnet motors.

The apparatus is preferably configured to transfer the semiconductor dies from the arrangement of semiconductor dies onto the target directly. The releasing unit can be configured for releasing a semiconductor die from the arrangement of semiconductor dies such that it falls onto the target. In this case, the releasing unit is not engaging the semiconductor die at the moment it arrives at the desired position on the target. In other embodiments, an auxiliary unit can be used to direct the released semiconductor die to the target. For example, a burst of compressed air may be used to push the released semiconductor die towards the target. In such cases, the semiconductor die can be displaced towards the target against Earth's gravitational force.

The wafer chuck can be configured to support a carrier by which the arrangement of semiconductor dies is carried. For example, the carrier can be a tape, film, or foil. Furthermore, the carrier can be part of a film frame carrier.

The arrangement of semiconductor dies can be comprised by a diced semiconductor wafer or by a structured semiconductor wafer. A structured semiconductor wafer may comprise a plurality of semiconductor dies that are arranged in a pattern that is different from a pattern in which the dies were arranged prior to dicing the semiconductor wafer they originate from. Alternatively, a structured semiconductor wafer may comprise a plurality of semiconductor dies that originate from different semiconductor wafers. In such case, the semiconductor dies have been individually placed onto a carrier such as a film, foil, or tape.

The rotational axis preferably runs at least substantially parallel to the target chuck. In this manner, the position of the releasing unit can be kept constant when rotating the curved shell to bring a next semiconductor die into alignment with the releasing unit provided that this die needs to be released at the same position as the previous semiconductor die. Here, it is noted that the target is typically moved when a next semiconductor die is to be released. Moreover, the rotational axis may coincide with a longitudinal axis of symmetry of the curved shell.

The wafer stage may further comprise a second motor for translating the curved shell, preferably back and forth along a direction parallel to and/or coinciding with the rotational axis. The wafer stage may further comprise another second motor for translating the curved shell in a perpendicular direction compared to the direction imparted by the second motor. For example, the second motor and said another second motor could cooperate for translating the curved shell in a XY plane similar to the plane in which the target table of the target stage is translated.

The wafer stage may further comprise an auxiliary second motor for translating the curved shell in a direction perpendicular to the rotational axis, preferably back and forth along a direction that is perpendicular to the target chuck. For example, the auxiliary second motor may be configured for vertically displacing the curved shell to ensure or maintain a particular vertical separation between the semiconductor die to be released and the target. If such separation is too small, the target and the semiconductor die may touch during motion of the target and/or curved shell. If the separation becomes too large, the variation in position and/or orientation of the semiconductor die on the target may become unacceptable.

Additionally, or alternatively, the apparatus may further comprise a stationary frame and a first carriage, wherein the second motor and/or auxiliary second motor is configured for translating the first carriage relative to the stationary frame, and wherein the first motor is configured for rotating the curved shell relative to the first carriage. In this case, the rotation and translation of the curved shell are stacked. In other embodiments, the second motor and/or auxiliary motor is configured for translating the curved shell relative to the stationary frame, and the first motor is configured for rotating the curved shell relative to stationary frame. In this case, the rotation and translation are performed independently from each other relative to the stationary frame.

The curved shell can at least be partially translucent for light having a first wavelength. In this case, the releasing unit may comprise a light source, such as a laser, for outputting a beam of light having said wavelength. The arrangement of semiconductor dies can be attached to a tape, foil, or film using a light-absorbing agent, such as a photosensitive adhesive. The light-absorbing agent can be configured to at least locally release its attachment with the arrangement of semiconductor dies when illuminated by light having said wavelength. For example, the light-absorbing agent can be configured to at least locally release its attachment by means of photo-ablation and/or by the light-absorbing agent undergoing a chemical reaction as a result of absorbing the light. The light source can be configured to illuminate a given semiconductor die of the arrangement of semiconductor dies separate from semiconductor dies that are adjacent to said given semiconductor die. For example, the light source can be configured to illuminate one semiconductor die of the arrangement of semiconductor dies at a time. However, the releasing unit may comprise a beam splitter configured for receiving the light beam from the light source and for splitting said received beam into a plurality of further beams, wherein each further beam is configured to illuminate a respective given semiconductor die.

The light source can be configured to emit light towards the curved shell, preferably in a substantially perpendicular manner. The light source is then preferably arranged inside and/or above or below the curved shell, Alternatively, the light source can be configured to emit light in a direction that is substantially parallel to the rotational axis. In this case, the releasing unit may further comprise a light directing unit. The light source can be configured to emit light towards the light directing unit preferably substantially parallel to the rotational axis, and the light directing unit can be configured for directing light from the light source towards the curved shell, preferably in a substantially perpendicular manner. In this case, the light source can be arranged outside of and/or next to the curved shell.

The light directing unit may comprise one or more mirrors, and/or one or more prisms. Furthermore, the light directing unit may comprise one or more actuators, preferably controllable by the controller, wherein the one or more actuators are configured for changing an orientation of the one or more mirrors and/or one or more prisms relative to incoming light from the light source for the purpose of directing the light from the light source under a different angle towards the curved shell. In this manner, the place at which the light from the light source impinges on the curved shell can be changed even if the latter does not change its position along its longitudinal axis. The light directing unit may for example be MEMS based. For example, MEMS based mirrors are relatively lightweight allowing fast switching between adjacent dies to be transferred.

Instead of using light, the releasing unit may alternatively comprise an engaging element, such as a needle, and an actuator for moving the engaging element into and out of engagement with the arrangement of semiconductor dies for the purpose of releasing a semiconductor die from the arrangement of semiconductor dies. The engaging element is typically arranged inside and/or above or below the curved shell.

As stated above, the position where the releasing unit releases a semiconductor die from the arrangement of semiconductor dies needs to be changed in order to completely deplete the arrangement of semiconductor dies. To this end, the releasing unit may comprise a second carriage on which the light source or the combination of actuator and needle is mounted, and a third motor for moving the second carriage relative to the curved shell. In this case, the motion of the second carriage and the motion of the curved shell are stacked. Furthermore, typically, the third motor only displaces the second carriage relative to the curved shell along and/or parallel to the longitudinal axis of the curved shell. Alternatively, the releasing unit may comprise a second carriage on which the light source or the combination of actuator and needle is mounted, and a third motor for moving the second carriage relative to the stationary frame. Hence, in this case, the motion of the second carriage and the motion of the curved shell are independent from each other. In both cases, the second carriage can be configured to translate inside and/or above or below the curved shell. Furthermore, when the releasing unit comprises the above-mentioned light source and light directing unit, the light source may be fixedly attached to the stationary frame and the light directing unit may be mounted on the second carriage.

The target stage may further comprise a fourth motor and/or fifth motor for translating the target chuck in a plane that is preferably parallel to the rotational axis, and/or an auxiliary fourth motor for translating the target chuck in a direction perpendicular to the rotational axis, preferably back and forth along a direction that is perpendicular to the target chuck. The fourth and/or fifth motor can be arranged to translate the target chuck relative to the stationary frame. Alternatively, the motion in two mutual orthogonal directions can be stacked. For example, the fourth motor may displace a third carriage relative to the stationary frame, and the fifth motor may displace the target chuck relative to the third carriage.

The curved shell can be provided with a coupling unit for allowing the arrangement of semiconductor dies to be coupled to the curved shell. For example, the curved shell can be provided with a plurality of openings. In this case, the apparatus may further comprise a vacuum unit for generating a suction force exerted through the plurality of openings onto the arrangement of semiconductor dies. Alternatively, or additionally, the curved shell can be provided with a mechanical coupling unit for mechanically coupling the arrangement of semiconductor dies. The arrangement of semiconductor dies is preferably carried by a film frame carrier. In this case, the mechanical coupling unit preferably comprises a clamping unit for clamping the film frame carrier onto the curved shell.

The curved shell can be a circular cylindrical shell, such as a drum, or a partially circular cylindrical shell. For example, the shell can be a 1/n circular cylindrical shell. When n=2, the shape corresponds to a semi-circular cylindrical shell. When n=1, the shape corresponds to a circular cylindrical shell, such as a drum. However, aspects of the present disclosure equally relate to curved shells of which a cross section perpendicular to the rotational axis and/or longitudinal axis is not circular or partially circular. In these cases, it is preferred to mutually translate the curved shell and the target to maintain substantially constant separation between the target and the semiconductor die to be released next.

Having a curved shell on which the arrangement of dies is arranged offers possibilities for mounting inspection systems close to the position where the semiconductor dies are released. For example, the apparatus may comprise a first inspection system arranged for inspecting semiconductor dies from the arrangement of semiconductor dies prior to being placed on the target. The first inspection system can be arranged for determining a position and/or orientation of the semiconductor dies of the arrangement of semiconductor dies, wherein the controller is configured to control the wafer stage, target stage, and/or releasing unit in dependence of the determined position and/or orientation. When coupling the arrangement of semiconductor dies to the curved shell, the position and/or orientation of the semiconductor dies may change, for example due to wrinkling or other distortion of the carrier on which the semiconductor dies are arranged. The first inspection system may record the position and/or orientation of the semiconductor dies, preferably relative to the curved shell and/or relative to an ideal position and/or orientation of the semiconductor dies. This recorded position can then be used to perform a correction prior to releasing the die. For example, if a die has shifted along the rotational axis relative to its ideal position, the curved shell may perform a slight translation in the other direction prior to the releasing unit releasing the semiconductor die. In such case, the position of the releasing unit need not change. In other embodiments, the target is displaced together with the releasing unit while keeping the curved shell at the same position. In even further embodiments, the releasing unit, target, and curved shell are all moved.

The first inspection system may additionally or alternatively be arranged for determining whether a semiconductor die of the arrangement of semiconductor dies is damaged. In this case, the controller can be configured to control the wafer stage, target stage, and/or releasing unit to prevent that semiconductor die from being placed on the target if it has been determined that said semiconductor die is damaged. In this way, damaged semiconductor dies can be skipped.

The apparatus may comprise a second inspection system arranged for determining whether a semiconductor die has been released from the arrangement of semiconductor dies. The controller can then be configured to control the wafer stage, target stage, and/or releasing unit for releasing said semiconductor die if it was determined that said semiconductor die was not released. In this manner, the releasing unit may again try to release the semiconductor die.

Alternatively, or additionally, the apparatus may further comprise a third inspection system arranged for checking whether a semiconductor die has been properly placed on the target. In this case, the controller can be configured to store a position of said semiconductor die and/or an intended position of said semiconductor die on the target. At a later stage, the semiconductor die can be removed from the target at this position.

The first, second, and/or third inspection system may comprise a camera, wherein a same camera is preferably used for two or more among the first, second, and third inspection system. The camera(s) of the first, second, and/or third inspection system can be moveably mounted relative to the stationary frame. For example, the cameras can be configured to move along the longitudinal axis of the curved shell.

The releasing unit can be configured for releasing a semiconductor die from the arrangement of semiconductor dies, which semiconductor die is arranged at a release position relative to the stationary frame. The arrangement of semiconductor dies may comprise a plurality of semiconductor dies arranged in a matrix of rows and columns, wherein the rows extend at least substantially in parallel to the rotational axis.

The target may comprise a column or row of adjacently arranged placement positions at which respective semiconductor dies from the arrangement of semiconductor dies are to be placed, wherein the column or row of adjacently arranged placement positions extends at least substantially perpendicular or parallel to the rotational axis, respectively. An example of such target can be a carrier tape that comprise a plurality of cavities in which semiconductor dies are to be arranged. In this case, the controller can be configured to control the wafer stage to cause the curved shell to rotate, either intermittently or continuously, for placing semiconductor dies in a same column of the arrangement of semiconductor dies on respective placement positions of the target, and after having depleted said column of the arrangement of semiconductor dies of dies to be placed, cause a translation movement of the curved shell to shift to an adjacent column of semiconductor dies of the arrangement of semiconductor dies. Moreover, the controller can be configured to maintain the release position relative to the stationary frame during the translation movement of the curved shell to shift to an adjacent column of semiconductor dies of the arrangement of semiconductor dies. For example, the releasing unit may be stationary relative to the stationary frame while the curved shell is rotated and translated.

Further to the above, the target may comprise a plurality of said columns of adjacently arranged placement positions at which respective semiconductor dies from the arrangement of semiconductor dies are to be placed. In this case, the controller can be configured to control the wafer stage and/or target stage to cause a mutual translation movement between the target and the curved shell after all the placement positions in a same column on the target have been provided with a semiconductor die from the arrangement of semiconductor dies. In this case, the controller can be configured to maintain the release position relative to the stationary frame during said mutual translation movement between the target and the curved shell. Alternatively, the controller can be configured to maintain a position of the columns on the target in a direction parallel to the rotational axis relative to the stationary frame, and to change the release position to shift to a next column on the target after all the placement positions in a same column on the target have been provided with a semiconductor die from the arrangement of semiconductor dies.

The apparatus may comprise a plurality of the abovementioned releasing units for substantially simultaneously releasing semiconductor dies from the arrangement of semiconductor dies in different columns of placement positions on the target. Each releasing unit may be controlled independently by the controller.

According to a further aspect of the present disclosure, a wafer stage is provided that has a wafer chuck on which an arrangement of semiconductor dies can be arranged, wherein the wafer chuck comprises a rotationally mounted curved shell on which the arrangement of semiconductor dies can be arranged, and wherein the wafer stage further comprises a first motor for rotating the curved shell around a rotational axis. This wafer stage can further be configured as the wafer stage of the abovementioned apparatus.

According to a further aspect of the present disclosure, a film frame carrier is provided that is configured to be mounted on a curved shell of the apparatus described above. The film frame carrier may also be referred to as tape frame.

The film frame carrier comprises a ring-shaped body having mounting surface configured to be coupled to a supporting surface of a flexible carrier film, foil, or tape on which supporting surface an arrangement of semiconductor dies is arranged. The ring-shaped body may have a circular, rectangular, or square shape but is not limited thereto.

The ring-shaped body has an asymmetric bending stiffness allowing the ring-shaped body to be bent such that the mounting surface of the ring-shaped body changes from having a first shape to a second more concave shape and preventing or limiting the ring-shaped body to be bent such that the shape of the mounting surface becomes more convex than the first shape. Due to asymmetric bending stiffness, the ring-shaped body can be gripped at opposite sides for moving the ring-shaped body without losing rigidity. This enables automatic transfer of the film frame carrier onto the curved shell and/or it has enabled the wafer to be diced while being mounted on the flexible carrier film that in turn was coupled to the ring-shaped body. The first shape may correspond to the most convex shape the mounting surface can attain.

The asymmetric bending stiffness can be configured to allow the ring-shaped body to be bent such that the mounting surface of the ring-shaped body reversibly changes from having the first shape to the second more concave shape. Alternatively, the bending may result in plastic deformation of the ring-shaped body.

The first shape may correspond to an essentially flat shape. Additionally, or alternatively, the curvature of the mounting surface when having the first shape can be less than $0.2\ m^{-1}$, and wherein the curvature of the mounting surface when having the second shape can be more than $3.3\ m^{-1}$.

The ring-shaped body may comprise and/or can be at least partially formed by a leaf spring. Moreover, a surface of the leaf spring may form or be part of the mounting surface. The ring-shaped body may further comprise limiting means connected to the leaf spring for preventing or limiting the ring-shaped body to be bent such that the shape of the mounting surface becomes more convex than the first shape. The limiting means can be coupled to the leaf spring on a surface directed away from said mounting surface. Additionally, or alternatively, the limiting means may comprise a plurality of segments that are connected to the leaf spring, wherein when the mounting surface is in the first shape, adjacent segments abut each other thereby preventing or limiting bending the leaf spring such that the shape of the mounting surface becomes more convex than the first shape, and wherein the segments are configured to move away from abutment upon bending the leaf spring to transform the mounting surface from the first shape to a more concave shape.

Alternatively, the ring-shaped body may comprise a plurality of segments, wherein the segments are hingedly connected to each other. For example, a respective pair of adjacently arranged segments among the plurality of segments may be configured to pivot relative to each other about a respective rotational axis. Moreover, the rotational axes describing the pivotal movements of all pairs of adjacently arranged segments among the plurality of segments can be parallel to each other.

For at least one pair of adjacently arranged segments among the plurality of segments, one segment may comprise a first coupling structure arranged on a first end of said one segment and the other segment may comprise a second coupling structure arranged on a second end of said the other segment. The first coupling structure and the second coupling structure can be hingedly connected to each other to allow said one segment and said the other segment to pivot relative to each about a rotational axis. Said one segment may comprise said second coupling structure arranged on a second side of said one segment opposite to the first side of said one segment. Said the other segment may comprise said first coupling structure arranged on a first side of said the other segment opposite to the second side of said the other segment.

The first coupling structure may comprise a first opening, and the second coupling structure may comprise a protruding element that is rotatably received in said first opening and that defines the rotational axis. This protruding element can be a pin, rod, or shaft.

Alternatively, the first coupling structure may comprise a first opening, wherein the second coupling structure comprises a second opening, and wherein the film frame carrier comprises a shaft rotatably received in at least one of the first and second opening and that defines the rotational axis.

For said respective pair of adjacently arranged segments among the plurality of segments, one segment may comprise a first abutment surface and the other segment a second abutment surface. The first abutment surface and second abutment surface can be shaped and positioned relative to the rotational axis to abut each other for the purpose of preventing the ring-shaped body to be bent such that the shape of the mounting surface becomes more convex than the first shape when the mounting surface has the first shape.

The segments can be made a material chosen out of the group consisting of steel, aluminum, titanium, polymers, or combinations thereof.

According to a further aspect of the present disclosure, an assembly is provided that comprises the film frame carrier as defined above, and a carrier film, foil, or tape having a supporting surface on which an arrangement of dies is arranged, wherein the carrier film, foil, or tape with arrangement of dies is coupled with its supporting surface to the mounting surface of the film frame carrier.

The carrier film, foil, or tape can be provided with an attaching layer by which the arrangement of semiconductor dies is attached to the supporting surface and by which the carrier film, foil, or tape is coupled to the mounting surface of the film frame carrier. The attaching layer may comprise a light-absorbing agent, such as a photo-sensitive adhesive, wherein the light-absorbing agent is configured to at least locally release its attachment with the arrangement of semiconductor dies when illuminated by light having said wavelength. The light-absorbing agent can be configured to at least locally release its attachment by means of photo-ablation and/or by the light-absorbing agent undergoing a chemical reaction as a result of absorbing the light. More in particular, the energy absorbed by the light-absorbing layer may not only be used for releasing the semiconductor die but also to provide some propelling force driving the semiconductor die towards the target.

The arrangement of semiconductor dies is comprised by a diced semiconductor wafer or by a structured semiconductor wafer.

BRIEF DESCRIPTION OF DRAWINGS

So that the manner in which the features of the present disclosure can be understood in detail, a more particular description is made with reference to embodiments, some of which are illustrated in the appended figures. It is to be noted, however, that the appended figures illustrate only typical embodiments and are therefore not to be considered limiting of its scope. The figures are for facilitating an understanding of the disclosure and thus are not necessarily drawn to scale. Advantages of the subject matter claimed will become apparent to those skilled in the art upon reading this description in conjunction with the accompanying figures, in which like reference numerals have been used to designate like elements, and in which:

Hereinafter, embodiments will be presented in which a semiconductor die from a diced semiconductor wafer is placed on a target. The present disclosure is however not limited to placing semiconductor dies from diced semiconductor wafers. In general, semiconductor dies can be placed from an arrangement of dies including but not limited to diced semiconductor wafers and structured wafers.

DETAILED DESCRIPTION

Figure 1A:
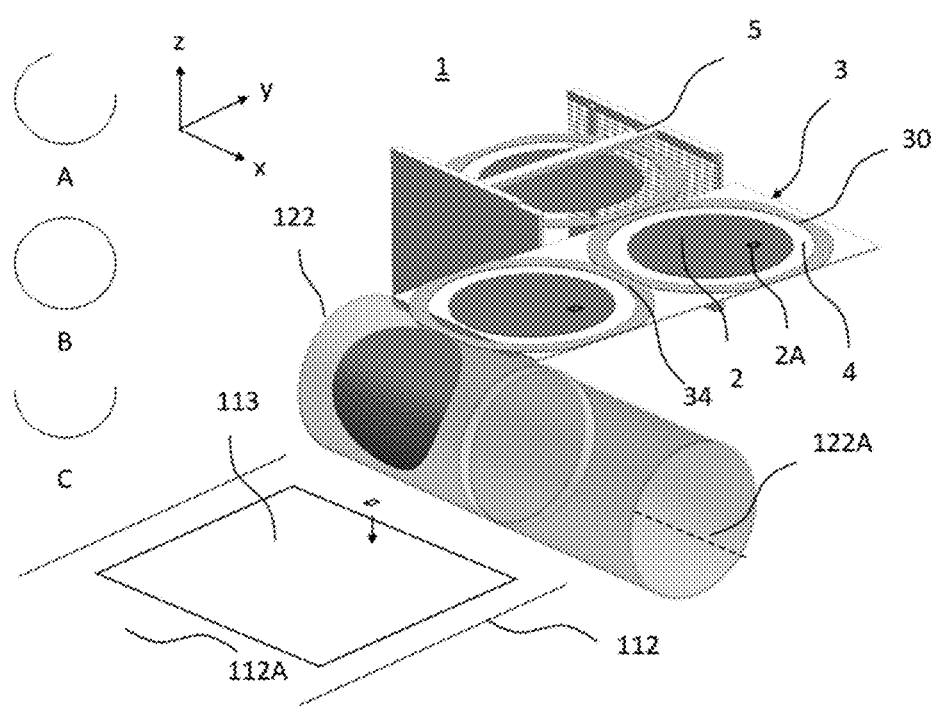
FIG. 1A illustrates part of an embodiment of an apparatus for placing a semiconductor die from an arrangement of semiconductor dies onto a target in accordance with an aspect of the present disclosure, and FIG. 1B a corresponding schematic representation.

FIG. 1A illustrates part of an embodiment of an apparatus 1 for placing a semiconductor die 2A from a diced semiconductor wafer 2 onto a target 113 in accordance with an aspect of the present disclosure. Here, diced semiconductor wafer 2 is arranged on a carrier film 4 that is mounted to a flexible film frame carrier, FFFC, 3. Typically, wafers are fed to apparatus 1 from a cassette 5, tray, or the like. This can be done in an automated manner.

Figure 5:
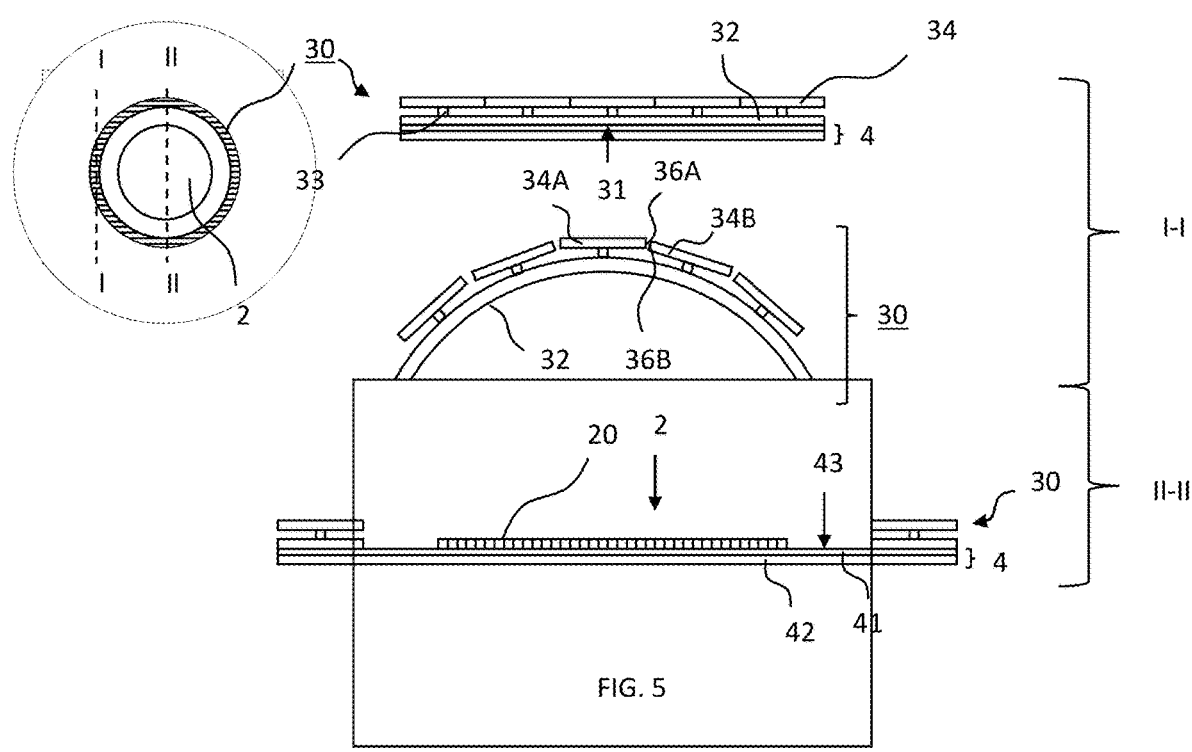
FIG. 5 illustrates a ring-shaped body for a flexible film frame carrier in accordance with an aspect of the present disclosure.

FFFC 3, of which cross-sections are shown in FIG. 5, comprises a ring-shaped body 30 having a mounting surface 31 that is coupled to a supporting surface 43 of carrier film 4. Here, flexible carrier film 4 comprises a backing/support layer 42, typically made of polyvinyl chloride, which is covered by an attaching layer 41. Using this latter layer, diced semiconductor wafer 2, which comprises a plurality of semiconductor dies 2A, is attached to backing layer 42.

Ring-shaped body 30 has an asymmetric bending stiffness allowing ring-shaped body 30 to be bent such that mounting surface 31 changes from having a first shape, as shown in the top figure of FIG. 5, to a second more concave shape, as shown in the center figure of FIG. 5. At the same time, the asymmetric stiffness prevents ring-shaped body 30 to be bent such that the shape of mounting surface 31 becomes more convex than the first shape.

Ring-shaped body 30 comprises a leaf spring 32, and a plurality of segments 34 that are each connected to leaf spring 32 using a respective connection 33. In the first shape, adjacent segments 34, and more in particular a surface 35A of one segment 34A and a surface 35B of an adjacent segment 34B, abut each other. Consequently, ring-shaped body 30 is not able to be bent by moving the left and right ends upwards relative to a center part of ring-shaped body 30 in FIG. 5. However, the opposite is possible in which the mounting surface 31 assumes a more concave shape. This is shown in FIG. 5, center figure. Here, segments 34A, 34B have moved out of abutment. Using a leaf spring 32 allows the shape deformation of ring-shaped body 30 to be reversible. However, embodiments are equally possible in which the bending from the first to the second shape comprises a plastic deformation. With such embodiments, the ring-shaped body 30 may be discarded after use.

Figure 4:
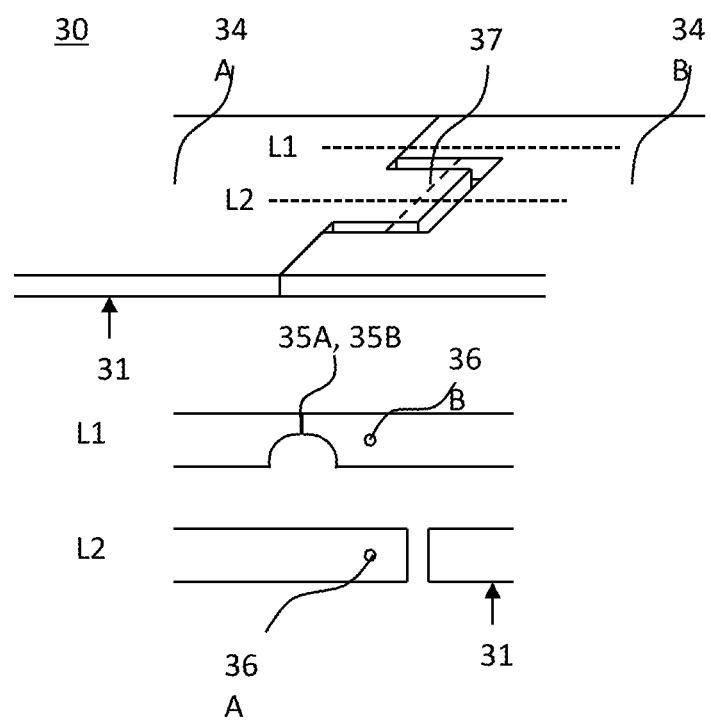
FIG. 4 illustrates a first embodiment of a flexible film frame carrier in accordance with an aspect of the present disclosure.

Another embodiment of a ring-shaped body 30 for a FFFC having an asymmetric bending stiffness is shown in FIG. 4. In this embodiment, ring-shaped body 30 comprises a plurality of segments 34, which segments are hingedly connected. For example, FIG. 4 illustrates a segment 34A and a segment 34B. These segments comprise openings 36A, 36B, respectively, in which a shaft 37 is arranged by which segments 34A, 34B are hingedly connected to each other. This is shown in more detail in the cross-sectional views corresponding to lines L1, L2. Shaft 37 can be fixedly connected to one of segments 34A, 34B while it is allowed to rotate in opening 36A, 36B of the other. Alternatively, shaft 37 can rotate in both openings 36A, 36B.

In FIG. 4, mounting surface 31 of ring-shaped body 30 is shown in the first shape, which is an essentially flat shape. Similar to the embodiment in FIG. 5, mounting surface 31 can be coupled to a supporting surface 43 of a carrier film 4. Segments 34A, 34B comprise abutting surfaces 35A, 35B, respectively. The positioning of surfaces 35A, 35B relative to shaft 37 determines that ring-shaped body 30 cannot be bent such that mounting surface 31 becomes more convex. However, bending ring-shaped body 30 such that mounting surface 31 becomes more concave is possible. It should be noted that surfaces 35A, 35B may be positioned differently. For example, they may be substantially in line with shaft 37 albeit at a differential longitudinal position.

Now returning to FIG. 1A, FFFC 3, embodied as illustrated in FIG. 5 and having a diced semiconductor wafer 2 arranged thereon can be mounted on a rotatably mounted curved shell 122, which can rotate about a rotational axis 122A. To this end, curved shell 122 may be provided with a number of small openings through which a suction force can be exerted onto FFFC 3. Alternatively, FFFC 3 may be mounted on curved shell 122 using a mechanical mounting such as clamping.

It is noted that FIG. 1A does not display ring-shaped body 30 for semiconductor wafer 2 that is arranged on curved shell 122 for illustrative purposes. Furthermore, FIG. 1A illustrates that segments 34 are generally elongated having a longitudinal axis that is parallel to rotational axis 122A.

By rotating and translating curved shell 122, diced semiconductor wafer 2 can be positioned relative to a target 113 on which semiconductor dies 2A are to be arranged. Target 113 is arranged on a supporting surface 112A of a target chuck 112. Once properly positioned, a releasing unit (not shown in FIG. 1A) is employed for releasing a semiconductor die 2A from diced semiconductor wafer 2 allowing semiconductor die 2A to be arranged on an intended position on target 113.

Figure 1B:
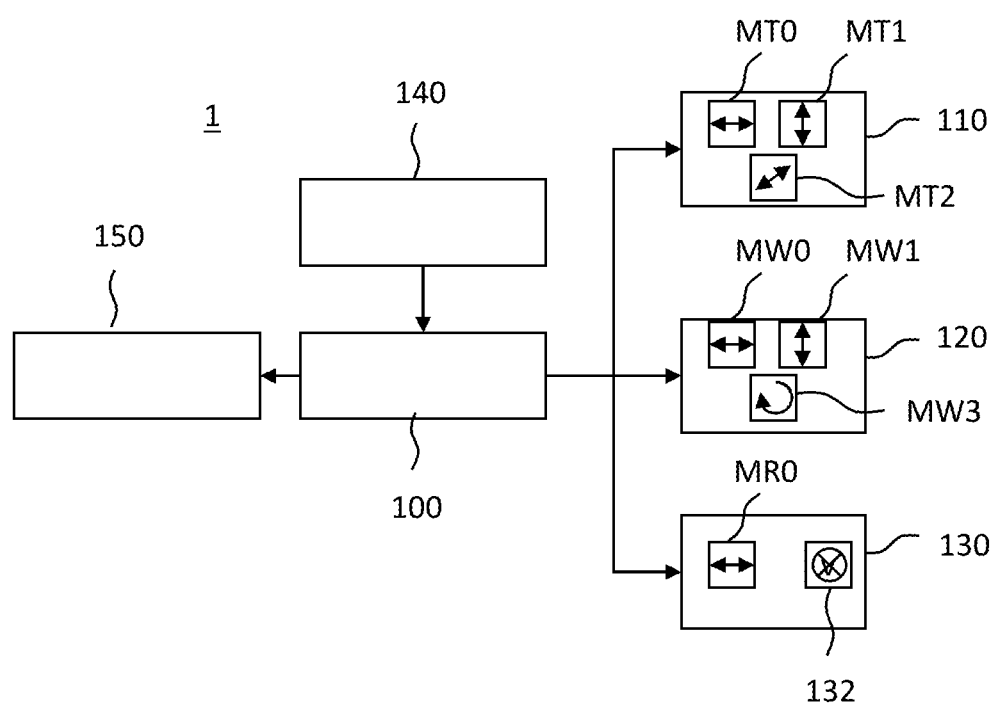

FIG. 1B schematically illustrates the apparatus of FIG. 1A. As shown, apparatus 1 comprises a controller 100 that controls a target stage 110, a wafer stage 120, and a releasing unit 130, based on data it receives from inspection system 140. Controller 100 further controls a dispensing apparatus 150 that is configured for dispensing small droplets of conductive glue 151, solder or the like, on target 113.

Target stage 110 comprises one or more motors for controlling the position of target chuck 112 on which target 113 is arranged. For example, target stage 110 may comprise a motor MT0 for translating target chuck 112 along the X-direction, which is taken parallel to rotational axis 122A, a motor MT2 for translating target chuck 112 along the Z-direction, which is taken perpendicular to supporting surface 112A of target chuck 112, and a motor MT1 for translating target chuck 112 along the Y-direction, which is taken perpendicular to the X-direction and Z-direction.

Wafer stage 120 comprises one or more motors for controlling the position of curved shell 122 on which semiconductor wafer 2 is arranged. For example, wafer stage 120 may comprise a motor MW0 for translating curved shell 122 along the X-direction, a motor MW2 for translating curved shell 122 along the Z-direction, and a motor MW3 for rotating curved shell 122 about rotational axis 122A.

Releasing unit 130 may comprise a motor MR0 for translating a light source 132 in the X-direction.

It should be noted that the present disclosure is not limited to the abovementioned combination of motors. Target stage 110, wafer stage 120, and releasing unit 130 may comprise more or less motors, and/or motors for translating in a different direction.

Inspection system 150 may comprise one or more optical cameras for recording images of semiconductor wafer 2 and/or semiconductor dies 2A arranged therein, and/or target 113. Based on these recorded images, which may in the form of still or moving images, controller 100 controls target stage 110, wafer stage 120, and/or releasing unit 130 to ensure that each semiconductor die 2A to be placed is arranged on an intended position on target 113. This placing process will be described next in more detail referring to FIG. 2.

Figure 2:
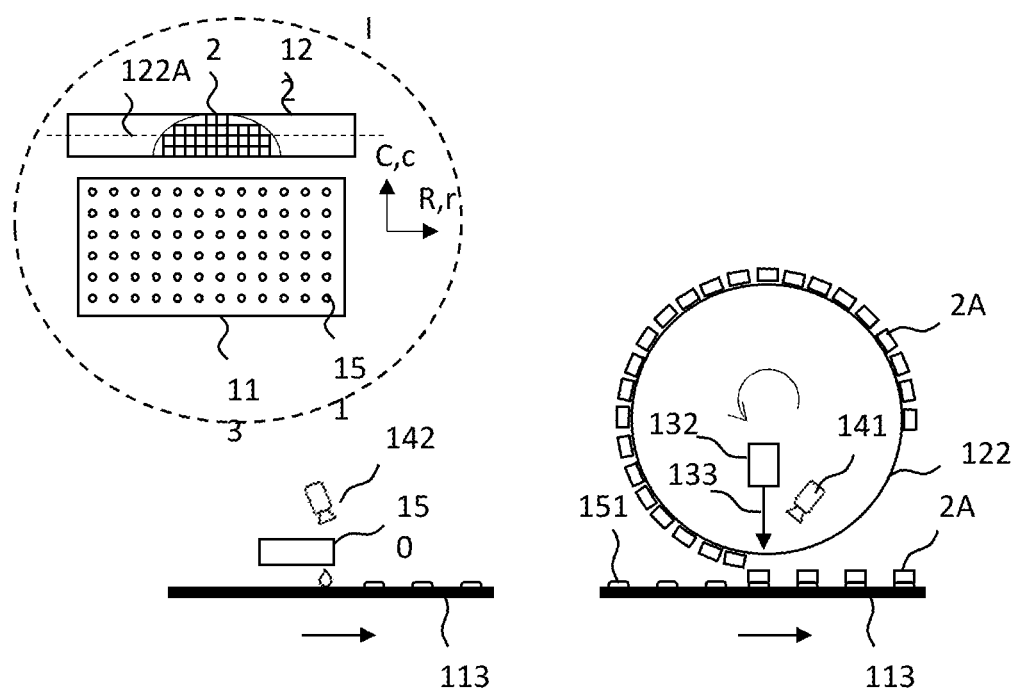
FIG. 2 illustrates a schematic cross-sectional view corresponding to the apparatus of FIG. 1A.

FIG. 2 illustrates a schematic cross-sectional view corresponding to the apparatus of FIG. 1. Here, a target 113 is shown, for example a printed circuit board. Target 113 comprises a plurality of intended placement positions on which a semiconductor die 2A from diced semiconductor wafer 2 needs to be placed. Prior to arranging a semiconductor die 2A, a droplet 151 of conductive glue, solder, or the like, is provided, e.g. dispensed, on target 113 by dispensing apparatus 150.

As shown in insert I, target 113 may be provided with a plurality of droplets 151 that are arranged in rows R and columns C. Similarly, semiconductor dies 2A may also be arranged in a matrix of rows r and columns c on semiconductor wafer 2. Here, it is assumed that columns c on diced semiconductor wafer 2 and columns C on target 113 each extend perpendicular to the longitudinal axis curved shell 122 and/or rotational axis 122A.

After having deposited or otherwise arranged droplets 151 on target 113, target 113 is moved underneath curved shell 122 to receive a semiconductor die 2A that is released from diced semiconductor wafer 2. To that end, releasing unit 130 is used.

Curved shell 122 has, at least for the most part, a constant cross section along rotational axis 122A. Curved shell 122 can be a partially circular or circular cylindrical shell. Various examples of a cross section of curved shell 122 are shown in FIG. 1A. Here, example A corresponds to a partially circular cylindrical shell, example B to a circular cylindrical shell, and example C to a further partially circular cylindrical shell, namely a semi-circular cylindrical shell.

Now referring again to FIG. 2, releasing unit 130 comprises a laser source 132 that emits a beam 133 of light through curved shell 122 onto a semiconductor die 2A to be released from carrier film 4. To that end, curved shell 122 is at least partially translucent, at least for the light coming from laser source 132. Curved shell 122 can be made entirely of translucent material or it can have particular regions that are translucent whereas others are not. For example, curved shell 122 can be made of glass, quartz, or fused silica.

Attaching layer 41 comprises a light-absorbing agent, such as a photo-sensitive adhesive. Once attaching layer 41 has been irradiated with light from laser source 132, it will lose its attachment with semiconductor die 2A. For example, the absorption of light will cause a chemical reaction of the light-absorbing agent as a result of which the adhesive properties of attaching layer 41 will diminish. Additionally, or alternatively, absorption of light may cause a sharp and local increase in temperature. This may even lead to local ablation and/or the production of gaseous components that would propel the released semiconductor die 2A towards target 113.

After losing attachment, semiconductor die 2A falls down onto an intended placement position on target 113. Thereafter, curved shell 122 is rotated by motor M3 to bring another semiconductor die 2A into alignment with laser source 132. Furthermore, curved shell 122 and target 113 are mutually translated to bring a next intended placement position at the correct position relative to curved shell 122.

As shown in FIG. 2, various inspection systems can be mounted. An inspection system can be used for inspecting semiconductor dies 2A from diced semiconductor wafer 2 prior to being placed on target 113. Such inspection may comprise determining position and orientation of semiconductor dies 2A. This allows a final correction to be made, for example by translating curved shell 122, target 113, and/or laser source 132 prior to releasing a semiconductor die 2A. It is noted that each semiconductor die 2A may be slightly offset from its ideal position and/or orientation. Such deviation may occur during dicing and/or when mounting FFFC 3 onto curved shell 122. Recording such deviation is possible by one or more cameras 141 of inspection system 140. Because curved shell 122 is at least locally translucent, camera(s) 141 can also be arranged inside curved shell 122.

Another or the same camera can also be used for checking whether a semiconductor die 2A is damaged prior to releasing that die. If it is determined that a semiconductor die 2A is damaged, it may be decided, by controller 100 of apparatus 1, to skip that semiconductor die.

Another or the same camera can also be used for checking whether a semiconductor die 2A has been released. If it is determined that this semiconductor die was not released, a new releasing attempt can be made.

Inspection system 140 may also, using a camera 142, check of droplets 151 are correctly placed on target 113 and/or monitor or check the position and/or orientation of target 113.

It is noted that due to the curved nature of curved shell 122, it is possible to closely arrange the camera(s) of inspection system 140 to the semiconductor die 2A it needs to inspect.

FIGS. 3A-3E illustrate further embodiments of an apparatus for directly placing a semiconductor die from a diced semiconductor wafer onto a target in accordance with an aspect of the present disclosure.

Each of the embodiments shown in FIGS. 3A-3E comprises a stationary frame 160, which functions as a reference for the various movements inside the apparatus.

Figure 3A:
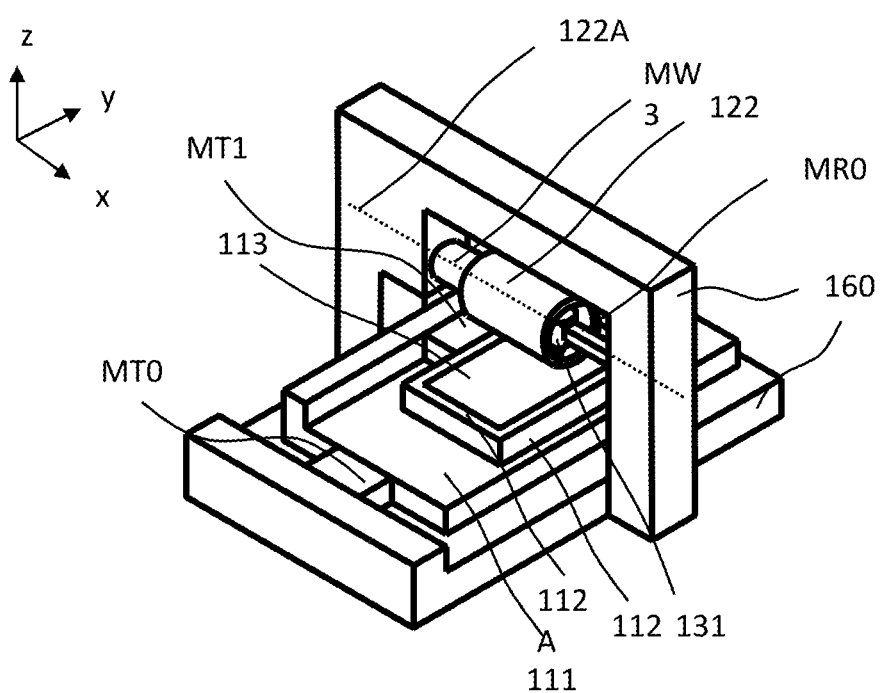
FIGS. 3A, 3B, 3C, 3D and 3E illustrate further embodiments and views of an apparatus for placing a semiconductor die from an arrangement of semiconductor dies onto a target in accordance with an aspect of the present disclosure.

In FIG. 3A, a motor MT0 is used for translating a carriage 111 relative to frame 160 in the x-direction. A motor MT1 is used for translating target chuck 112 relative to carriage 111 in the y-direction. Furthermore, a motor MW3 is used for rotating curved shell 122 relative to frame 160.

Laser source 132 is mounted on a carriage 131 that is translated relative to frame 160 in the x-direction using a motor MR0.

The apparatus of FIG. 3A can be used for placing a plurality of semiconductor dies 2A onto target 113 in a plurality of spaced apart columns that extend perpendicular to rotational axis 122A.

For example, target 113 can be translated in the y-direction while rotating curved shell 122 to place semiconductor dies 2A that are arranged in a same column on semiconductor wafer 2. Once a column on semiconductor wafer 2 is depleted, laser source 132 and target chuck 112 are translated in the x-direction such that both target chuck 112 and laser source 132 are aligned with a next column of semiconductor dies 2A on semiconductor wafer 2. Once a complete column on target 113 is filled, target chuck 112 is moved in the x-direction to position a new column to be filed underneath curved shell 122.

Figure 3B:
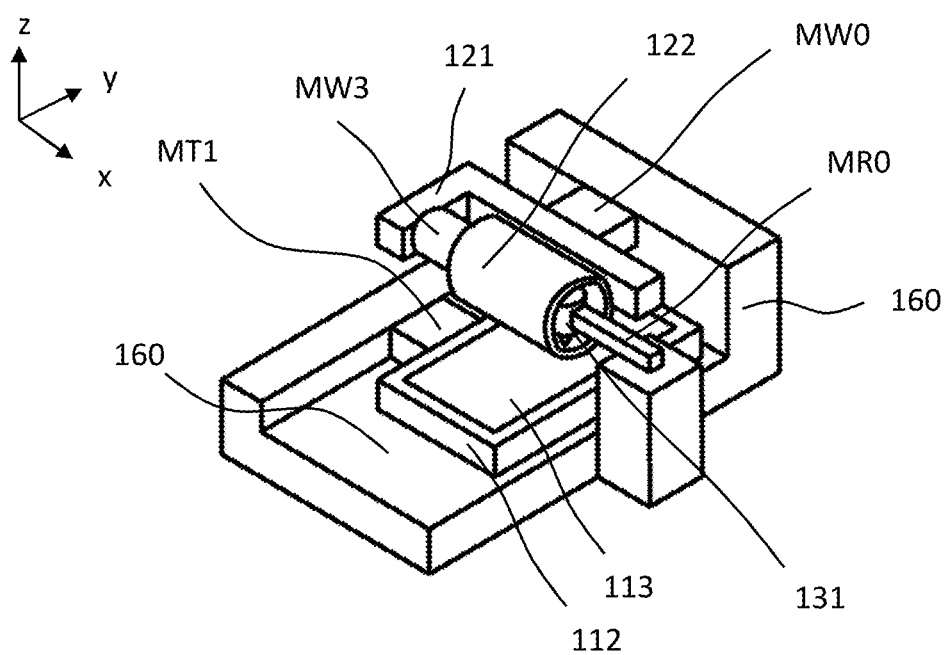

In the embodiment shown in FIG. 3B, target chuck 112 can be translated only in the y-direction using motor MT1. Curved shell 122 can be rotated using motor MW3 relative to a carriage 121. In turn, carriage 121 can be translated in the x-direction using motor MW0. Laser source 132, which is mounted on a carriage 131, can be translated in the x-direction using motor MR0 relative to frame 160, which is partially omitted here for illustrative purposes. Motor MR0 may for example comprise a ball screw, a lead screw, a belt drive, or a linear motor, for imparting the translation of carriage 131.

Figure 3C:
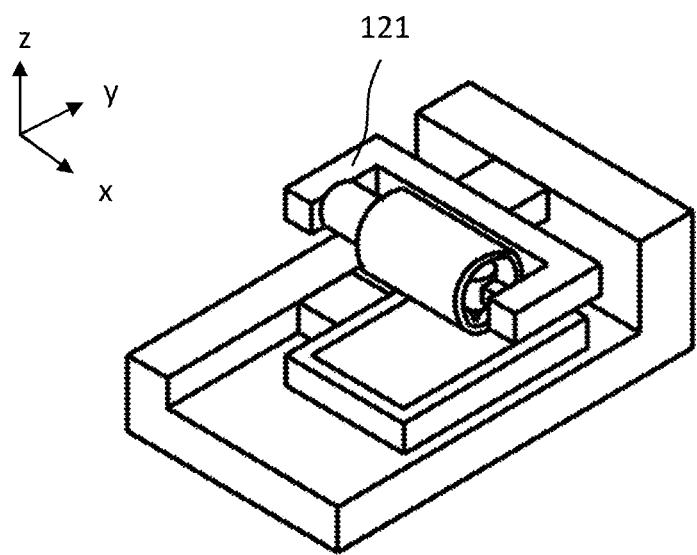

The apparatus shown in FIG. 3C differs from the embodiment shown in FIG. 3B in that motor MR0 translates carriage 131 relative to carriage 121 instead of frame 160.

Figure 3D:
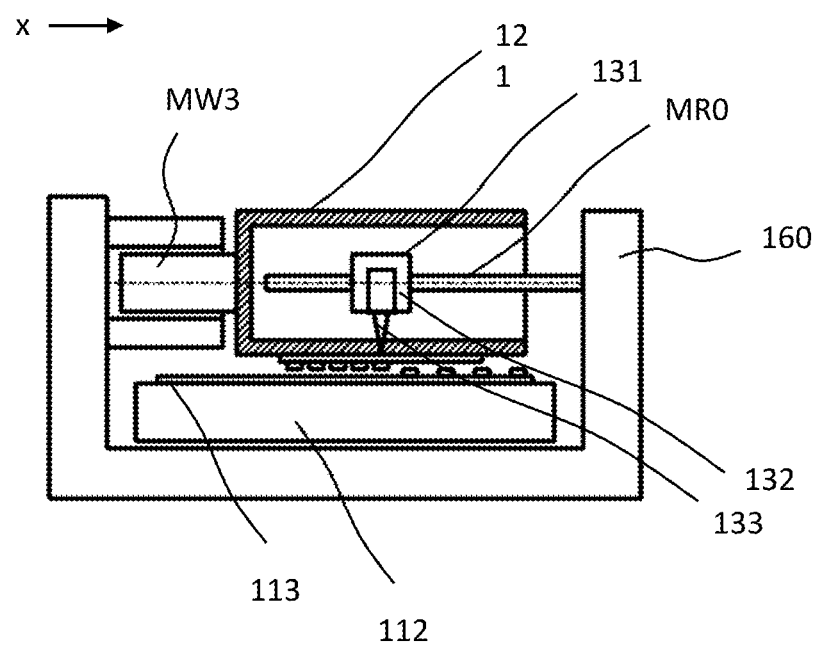
Figure 3E:
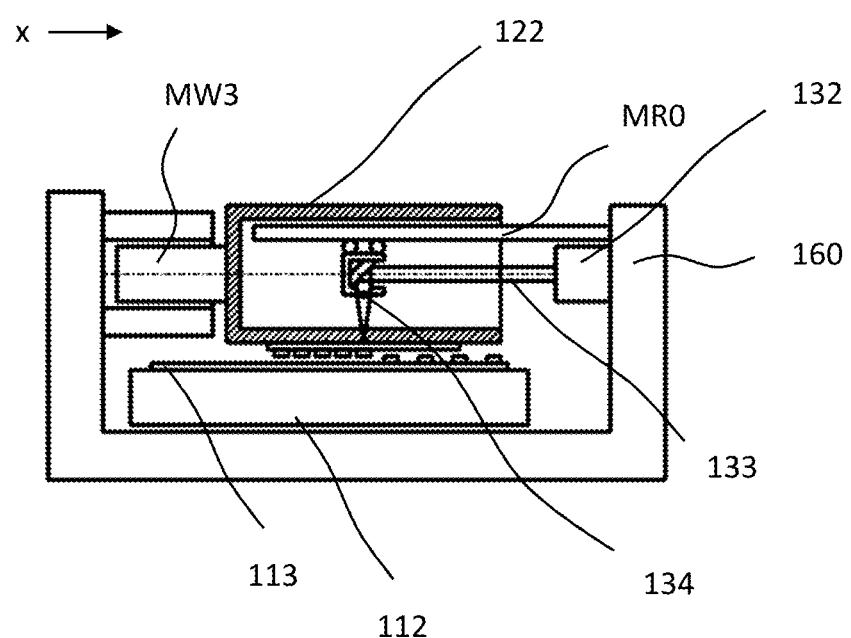

FIGS. 3D and 3E illustrate cross-sectional views that correspond to the apparatus shown in FIG. 3A. More in particular, target chuck 112 is able to translate in the x-direction and y-direction, and curved shell 122 can only rotate relative to frame 160. Laser source 132 can only translate in the x-direction relative to frame 160 using motor MR0.

In FIG. 3D, laser source 132 emits a beam 133 of light through translucent curved shell 122 onto the attaching layer by which semiconductor dies 2A are attached to the carrier film. Alternatively, releasing unit 130 may comprise a needle and a needle actuator for bringing the needle into and out of engagement with an underlying semiconductor die. In this case, the needle actuator and needle are both arranged inside curved shell 122 and are both translated in the x-direction.

In FIG. 3E, laser source 132 is mounted outside curved shell 122. It emits a beam 133 of light towards a mirror unit 134. Mirror unit 134 deflects the light onto and through curved shell 122. Mirror unit 134 may comprise one or more mirrors and one or more mirror actuators to allow the angle of deflection to be changed. Mirror unit 134 can translate in the x-direction using a motor MR0, which can for example be embodied as a linear motor.

In the above, the present disclosure has been described using detailed embodiments thereof. However, the present disclosure is not limited to these embodiments. Instead, various modifications are possible without departing from the scope of the present disclosure which is defined by the appended claims and their equivalents.

Particular and preferred aspects of the disclosure are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalization thereof irrespective of whether or not it relates to the claimed disclosure or mitigate against any or all of the problems addressed by the present disclosure. The applicant hereby gives notice that new claims may be formulated to such features during prosecution of this application or of any such further application derived therefrom. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

The term "comprising" does not exclude other elements or steps, the term "a" or "an" does not exclude a plurality. Reference signs in the claims shall not be construed as limiting the scope of the claims.

| LIST OF REFERENCE SIGNS | |
|---|---|
| apparatus | 1 |
| semiconductor wafer | 2 |
| semiconductor die | 2A |
| film frame carrier | 3 |
| carrier film | 4 |
| cassette | 5 |
| ring-shaped body | 30 |
| mounting surface | 31 |

-continued

LIST OF REFERENCE SIGNS

| | |
|---|---|
| leaf spring | 32 |
| connection | 33 |
| segments | 34, 34A, 34B |
| abutting surface | 35A, 35B |
| opening | 36A, 35B |
| shaft | 37 |
| attaching layer | 41 |
| backing layer | 42 |
| supporting surface | 43 |
| controller | 100 |
| target stage | 110 |
| carriage target stage | 111 |
| target chuck | 112 |
| target | 113 |
| wafer stage | 120 |
| carrier wafer stage | 121 |
| curved shell | 122 |
| rotational axis | 122A |
| releasing unit | 130 |
| carrier releasing unit | 131 |
| laser source | 132 |
| beam of light | 133 |
| mirror unit | 134 |
| inspection system | 140 |
| camera | 141, 142 |
| dispensing apparatus | 150 |
| droplet of glue/solder | 151 |
| stationary frame | 160 |
| motor X-direction | M0 |
| motor y-direction | M1 |
| motor z-direction | M2 |
| motor rotation | M3 |

What is claimed is:

1. An apparatus for transferring a semiconductor die from an arrangement of semiconductor dies to a target, comprising:
   a wafer stage having a wafer chuck on which the arrangement of semiconductor dies can be arranged;
   a target stage having a target chuck on which a target can be arranged on which the semiconductor dies from the arrangement of semiconductor dies are to be placed;
   a releasing unit for releasing a semiconductor die from the arrangement of semiconductor dies; and
   a controller for controlling the releasing unit, the wafer stage, and the target stage;
   wherein the wafer chuck comprises a rotationally mounted curved shell on which the arrangement of semiconductor dies can be arranged, and wherein the wafer stage further comprises a first motor for rotating the curved shell around a rotational axis; and
   wherein the curved shell is a circular cylindrical shell or a partially circular cylindrical shell.

2. The apparatus according to claim 1, wherein the apparatus is configured to transfer the semiconductor dies from the arrangement of semiconductor dies onto the target directly, and/or wherein the releasing unit is configured to release a semiconductor die from the arrangement of semiconductor dies so that it falls onto the target.

3. The apparatus according to claim 1, wherein the wafer chuck is configured to support a carrier by which the arrangement of semiconductor dies is carried, wherein the carrier is selected from the group consisting of a tape, a film, and a foil, and wherein the carrier is part of a film frame carrier.

4. The apparatus according to claim 1, wherein the arrangement of semiconductor dies is comprised by a diced semiconductor wafer or by a structured semiconductor wafer; and/or
   wherein the rotational axis runs at least substantially parallel to the target chuck; and/or
   wherein the rotational axis coincides with a longitudinal axis of symmetry of the curved shell.

5. The apparatus according to claim 1, wherein the wafer stage further comprises a second motor for translating the curved shell back and forth along a direction parallel to and/or coinciding with the rotational axis, and/or wherein the wafer stage further comprises an auxiliary second motor for translating the curved shell in a direction perpendicular to the rotational axis back and forth along a direction that is perpendicular to the target chuck;
   wherein the apparatus further comprises a stationary frame and a first carriage, wherein the second motor and/or auxiliary second motor is configured to translate the first carriage relative to the stationary frame, and wherein the first motor is configured to rotate the curved shell relative to the first carriage; or
   wherein the apparatus further comprises a stationary frame, wherein the second motor and/or auxiliary second motor is configured to translate the curved shell relative to the stationary frame, and wherein the first motor is configured to rotate the curved shell relative to stationary frame.

6. The apparatus according to claim 1, wherein the curved shell is provided with a coupling unit to allow the arrangement of semiconductor dies to be coupled to the curved shell;
   wherein curved shell is provided with a plurality of openings, the apparatus further comprising a vacuum unit configured to generate a suction force exerted through the plurality of openings onto the diced semiconductor wafer; and/or
   wherein the curved shell is provided with a mechanical coupling unit for mechanically coupling the arrangement of semiconductor dies, wherein the arrangement of semiconductor dies is carried by a film frame carrier, and wherein the mechanical coupling unit comprises a clamping unit for clamping the film frame carrier onto the curved shell.

7. The apparatus according to claim 1, further comprising a first inspection system arranged for inspecting semiconductor dies from the arrangement of semiconductor dies prior to being placed on the target;
   wherein the first inspection system is arranged to determine a position and/or orientation of the semiconductor dies of the arrangement of semiconductor dies, wherein the controller is configured to control the wafer stage, target stage, and/or releasing unit in dependence of the determined position and/or orientation; and/or
   wherein the first inspection system is arranged to determine whether a semiconductor die of the arrangement of semiconductor dies is damaged, wherein the controller is configured to control the wafer stage, target stage, and/or releasing unit to prevent that semiconductor die from being placed on the target if it has been determined that the semiconductor die is damaged; and/or
   wherein the apparatus further comprises a second inspection system arranged to determine whether a semiconductor die has been released from the arrangement of semiconductor dies, wherein the controller is configured to control the wafer stage, target stage, and/or releasing unit for releasing the semiconductor die if it was determined that the semiconductor die was not released; and/or wherein the apparatus further comprises a third inspection system arranged to check whether a semiconductor die has been properly placed on the target, wherein the controller is configured to store a position of the semiconductor die and/or an intended position of the semiconductor die on the target;

wherein the first, second, or third inspection system comprises a camera, used for two or more among the first, second, and third inspection system.

8. The apparatus according to claim 5, wherein the curved shell is at least partially translucent for light having a first wavelength, wherein the releasing unit comprises a light source, for outputting a beam of light having the wavelength, wherein the arrangement of semiconductor dies is attached to one material selected from the group consisting of a tape, foil, and film using a light-absorbing agent, and wherein the light-absorbing agent is configured to at least locally release its attachment with the arrangement of semiconductor dies when illuminated by light having the wavelength;

wherein the light-absorbing agent is configured to at least locally release its attachment by photo-ablation and/or by the light-absorbing agent undergoing a chemical reaction as a result of absorbing the light, and/or wherein the light source is configured to illuminate a given semiconductor die of the arrangement of semiconductor dies separate from semiconductor dies that are adjacent to the given semiconductor die, wherein the releasing unit comprises a beam splitter configured to receive the light beam from the light source and to split the received beam into a plurality of further beams, wherein each further beam is configured to illuminate a respective given semiconductor die; and wherein the light source is configured to emit light towards the curved shell, in a substantially perpendicular manner.

9. The apparatus according to claim 5, wherein the target stage further comprises a fourth motor and/or fifth motor for translating the target chuck in a plane that is parallel to the rotational axis, and/or an auxiliary fourth motor for translating the target chuck in a direction perpendicular to the rotational axis, back and forth along a direction that is perpendicular to the target chuck;

wherein the fourth and/or fifth motor are arranged to translate the target chuck relative to the stationary frame; or wherein the fourth motor is configured to displace a third carriage relative to the stationary frame, and wherein the fifth motor is configured to displace the target chuck relative to the third carriage.

10. The apparatus according to claim 5, wherein the releasing unit is configured to release a semiconductor die from the arrangement of semiconductor dies, the semiconductor die is arranged at a release position relative to the stationary frame; and wherein the arrangement of semiconductor dies comprises a plurality of semiconductor dies arranged in a matrix of rows and columns, and wherein the rows extend at least substantially in parallel to the rotational axis.

11. The apparatus according to claim 8, wherein the releasing unit further comprises a light directing unit, wherein the light source is configured to emit light towards the light directing unit substantially parallel to the rotational axis, wherein the light directing unit is configured to direct light from the light source towards the curved shell, in a substantially perpendicular manner, wherein the light directing unit comprises one or more mirrors and/or one or more prisms, wherein the light directing unit comprises one or more actuators, controllable by the controller, and wherein the one or more actuators are configured to change an orientation of the one or more mirrors and/or one or more prisms relative to incoming light from the light source to direct the light from the light source under a different angle towards the curved shell.

12. The apparatus according to claim 10, wherein the target comprises a column or row of adjacently arranged placement positions at which respective semiconductor dies from the arrangement of semiconductor dies are to be placed, the column or row of adjacently arranged placement positions extending at least substantially perpendicular or parallel to the rotational axis, respectively, and wherein the controller is configured to control the wafer stage to cause the curved shell to rotate, either intermittently or continuously, to place semiconductor dies in a same column of the arrangement of semiconductor dies on respective placement positions of the target, and after having depleted the column of the arrangement of semiconductor dies of dies to be placed, cause a translation movement of the curved shell to shift to an adjacent column of semiconductor dies of the arrangement of semiconductor dies; and wherein the controller is configured to maintain the release position relative to the stationary frame during the translation movement of the curved shell to shift to an adjacent column of semiconductor dies of the arrangement of semiconductor dies.

13. The apparatus according to claim 11, wherein the releasing unit comprises a second carriage on which the light source or the combination of actuator and needle is mounted, and a third motor for moving the second carriage relative to the curved shell, wherein the second carriage is configured to translate inside and/or above or below the curved shell, and wherein the light source is fixedly attached to the stationary frame, and wherein the light directing unit is mounted on the second carriage; or wherein the releasing unit comprises a second carriage on which the light source or the combination of actuator and needle is mounted, and a third motor for moving the second carriage relative to the stationary frame, wherein the second carriage is configured to translate inside and/or above or below the curved shell, wherein the light source is fixedly attached to the stationary frame, and wherein the light directing unit is mounted on the second carriage.

14. The apparatus according to claim 12, wherein the target comprises a plurality of the columns of adjacently arranged placement positions at which respective semiconductor dies from the arrangement of semiconductor dies are to be placed, wherein the controller is configured to control the wafer stage and/or target stage to cause a mutual translation movement between the target and the curved shell after all the placement positions in a same column on the target have been provided with a semiconductor die from the arrangement of semiconductor dies, wherein the controller is configured to maintain the release position relative to the stationary frame during the mutual translation movement between the target and the curved shell, or wherein the controller is configured to maintain a position of the columns on the target in a direction parallel to the rotational axis relative to the stationary frame, and to change the release position to shift to a next column on the target after all the placement positions in a same column on the target have been provided with a semiconductor die from the arrangement of semiconductor dies; and wherein the apparatus comprises a plurality of the releasing units to simultaneously release semiconductor dies from the arrangement of semiconductor dies in different columns of placement positions on the target.

15. A wafer stage configured to be used in the apparatus as defined in claim 1, comprising a wafer chuck on which an arrangement of semiconductor dies can be arranged, wherein the wafer chuck comprises a rotationally mounted curved shell on which the arrangement of semiconductor dies can be arranged, and wherein the wafer stage further comprises a first motor for rotating the curved shell around a rotational axis.

16. A wafer stage configured to be used in the apparatus as defined in claim 2, comprising a wafer chuck on which an arrangement of semiconductor dies can be arranged, wherein the wafer chuck comprises a rotationally mounted curved shell on which the arrangement of semiconductor dies can be arranged, and wherein the wafer stage further comprises a first motor for rotating the curved shell around a rotational axis.

17. A wafer stage configured to be used in the apparatus as defined in claim 5, comprising a wafer chuck on which an arrangement of semiconductor dies can be arranged, wherein the wafer chuck comprises a rotationally mounted curved shell on which the arrangement of semiconductor dies can be arranged, and wherein the wafer stage further comprises a first motor for rotating the curved shell around a rotational axis.

* * * * *